United States Patent [19]
Shihadeh et al.

[11] Patent Number: 5,814,847
[45] Date of Patent: Sep. 29, 1998

[54] GENERAL PURPOSE ASSEMBLY PROGRAMMABLE MULTI-CHIP PACKAGE SUBSTRATE

[75] Inventors: Elias E. Shihadeh, Nazareth, Israel; Peter M. Weiler, Palo Alto, Calif.

[73] Assignee: National Semiconductor Corp., Santa Clara, Calif.

[21] Appl. No.: 595,684

[22] Filed: Feb. 2, 1996

[51] Int. Cl.[6] .............................. H05K 1/02; H01L 27/02
[52] U.S. Cl. .................... 257/209; 257/700; 257/211; 257/208
[58] Field of Search .................... 257/208, 211, 257/207, 700, 758

[56] References Cited

U.S. PATENT DOCUMENTS

| | | | |
|---|---|---|---|
| 4,700,187 | 10/1987 | Farlek | 257/208 |
| 5,160,995 | 11/1992 | Wada et al. | 257/207 |
| 5,360,948 | 11/1994 | Thornberg | 174/263 |
| 5,432,477 | 7/1995 | Mowatt et al. | 361/719 |
| 5,432,708 | 7/1995 | Mohsen | 364/490 |
| 5,459,355 | 10/1995 | Kreifels | 257/208 |
| 5,541,814 | 7/1996 | Janai et al. | 257/209 |
| 5,625,207 | 4/1997 | Trolle et al. | 257/208 |

OTHER PUBLICATIONS

Burman, S. and Sherwani, N., "Programmable Multichip Modules", *IEEE Micro* 13:28–35 (1993).

Stopper, H. et al., "Programmable MCMs for High Speed Applications", ICEMCM 191–196 (1995).

*Primary Examiner*—Tom Thomas
*Assistant Examiner*—Alexander Oscar Williams
*Attorney, Agent, or Firm*—Skjerven, Morrill, MacPherson, Franklin & Friel LLP; Norman R. Klivans

[57] ABSTRACT

A multi-chip module interconnection substrate includes at least two layers of conductive traces separated by an intervening layer of insulating material. The conductive traces include straight segments and diagonal segments. A plurality of conductive vias, each including conductive via wing extensions, allow one to make electrical connections between the various conductive trace layers. The conductive vias are formed such that a narrow, non-conductive, gap exists between the via wing extensions and the conductive traces. The multi-chip module interconnection substrate is then programmed, e.g. in the field, by making electrical connections between the via wing extensions and the conductive traces using e.g. wire bonds or ball bonds formed by conventional wire bonding equipment.

16 Claims, 8 Drawing Sheets

GENERAL PURPOSE ASSEMBLY PROGRAMMABLE MULTI-CHIP PACKAGE SUBSTRATE

BACKGROUND OF THE INVENTION

1. Field of the Invention

This invention relates to electronic devices such as integrated circuits, hybrid circuits, and multi-chip integrated circuit modules and, in particular, to programmable multi-chip module packages.

2. Description of the Prior Art

A multi-chip module (MCM) is a package that has more than one electrical component mounted on an interconnection substrate which provides an interconnection path between the electrical components. The electrical components mounted on the interconnection substrate are typically integrated circuits; they may also be discrete circuit components such as resistors, capacitors, inductors, transistors and diodes.

The arrangement and interconnection of the electrical components on a multi-chip module substrate varies depending on the end application of the multi-chip module. Consequently, the connections between the conductive traces in the interconnection substrate of the multi-chip module must be varied for each application, i.e. a different arrangement of components requires a different interconnection of conductive traces for formation of the desired signal paths in the multi-chip module substrate.

Recently, programmable interconnection substrates for multi-chip modules have been introduced. However, these programmable substrates are typically complicated and expensive to manufacture and require specialized equipment to program the interconnections between the various conductive trace segments.

For instance, prior art multi-chip module interconnection substrates typically require an elaborate "programming" procedure; see U.S. Pat. No. 5,360,948 to Gary R. Thornberg issued Nov. 1, 1994. The Thornberg programming process involves: creating and applying a mask to the interconnection substrate surface; applying a layer of photoresist; etching to open signal paths; removing the photoresist; coating the substrate with photosensitive polyamide; forming contact vias; curing the photosensitive polyamide; depositing a metal (conductive) layer; creating and applying a second mask; etching away selected portions of the metal layer; removing the photoresist; applying overcoat protection such as polyamide; creating openings in the overcoat layer; and developing and curing the resulting substrate.

These thirteen steps for programming a multi-chip module are typical of the complexity of creating prior art programmable multi-chip module interconnection substrates. Consequently, prior art programmable multi-chip module interconnection substrates are typically expensive and difficult to produce.

A simple and inexpensive technique is needed to manufacture a multi-chip module substrate which is programmable and includes connections which can be made easily, e.g. by existing technology and equipment.

SUMMARY

According to the present invention, a programmable interconnection substrate for a multi-chip module includes: a first conductive trace layer formed within the interconnection substrate; a first insulating layer having a first surface and a second surface opposite the first surface, the second surface of the first insulating layer facing the first conductive trace layer; a second conductive trace layer formed on the first surface of the first insulating layer; and a plurality of conductive vias, each one of the plurality of conductive vias providing an opening from the second conductive trace layer, through the first insulating layer, to the first conductive trace layer, each of the plurality of conductive vias also including at least one conductive "via wing extension" extending from the conductive via along the first surface of the first insulation layer.

According to the invention, the via wing extensions each extend from the vias to within a predetermined distance from conductive traces on the second conductive trace layer. Consequently, non-conductive gaps are formed, i.e. the vias approach, but do not physically connect with, connection points on the second conductive trace layer.

In one embodiment of the invention, after the multi-chip module interconnection substrate is formed, wire bonds are used to bridge the gaps between the conductive via wing extensions and selected electrical conductors of the second conductive trace layer and thereby connect selected conductive via wing extensions to selected electrical conductors on the second conductive layer. Consequently, the wire bonds form selected electrical connections between the first and second conductive trace layers.

In another embodiment, after the multi-chip module interconnection substrate is formed, ball bonds are selectively deposited in the gaps between the conductive via wing extensions and selected electrical conductors of the second conductive trace layer. Consequently, in this embodiment, the ball bonds form selected electrical connections between the first and second conductive trace layers.

In one embodiment of the invention, the first conductive trace layer includes a first plurality of electrical conductors. These conductors each include straight segments oriented in a first direction, such as horizontal or vertical, and diagonal segments diagonally oriented at a pre-determined angle to the first direction. Similarly, the second conductive trace layer includes a second plurality of conductors which include straight segments oriented in a second, different, direction, such as vertical or horizontal, and diagonal segments diagonally oriented at a predetermined angle to this second direction.

The diagonal orientation advantageously allows mounting more dice on a substrate of given area, by allowing connection of the pads on one side of a die to one set of conductive channels on the substrate and connection of the pads on the other side of the die to a second offset set of conductive channels on the substrate.

The present structure and method allow the manufacture of non-specific or "general purpose" multi-chip module interconnection substrates which can be shipped to a potential middle man or supplier in a non-programmed state. The wire bonds or ball bonds discussed above can be formed by conventional wire bonding equipment well known in the art. Consequently, the multi-chip module interconnection substrates can be programmed with readily available wire bonding equipment, in many cases avoiding the need for additional programming equipment. Therefore, the present apparatus and method provide a simple and inexpensive multi-chip module substrate which is programmable, reliable, and durable.

DETAILED DESCRIPTION

The present invention is directed to an interconnection substrate for multi-chip modules which is standardized and more easily and inexpensively programmed than prior art interconnection substrates.

Base structures (not shown) for multi-chip module interconnection substrates are manufactured by well known standard techniques. These base structures are typically of a laminate material, such as used in printed circuit boards, or other well known materials. The base structure can also include conventional conductive power and ground layers.

Figure 1:
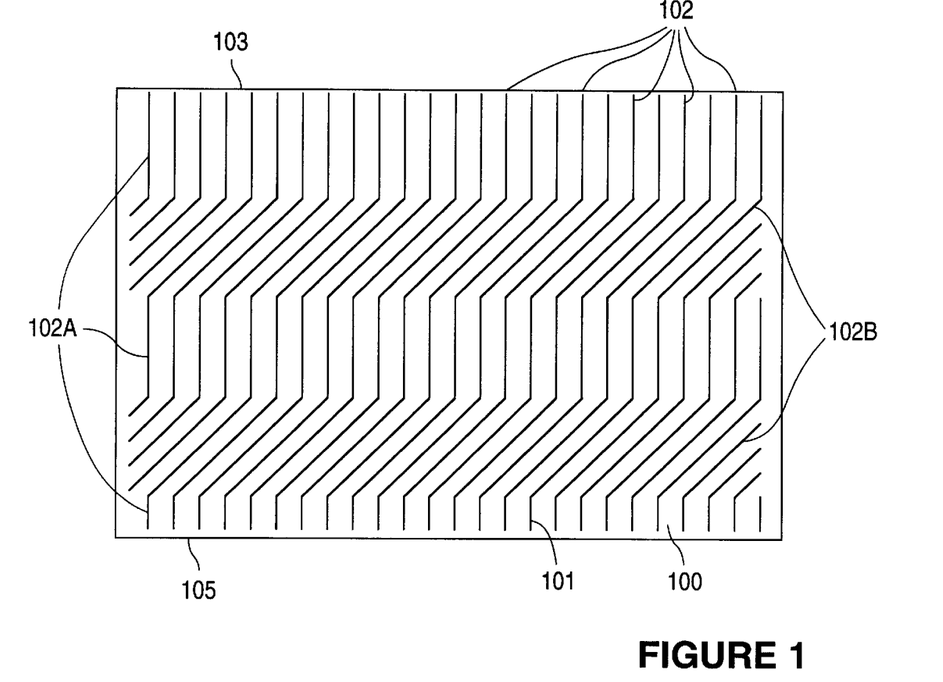
FIG. 1 shows a first conductive trace layer in accordance with the invention.

After the base structure is formed (or purchased), a multi-chip module interconnection substrate is created by applying alternating layers of conductive traces (hereinafter conductive trace layers) with intervening layers of insulating material, such as a polymer or polyamide, on the base structure. The conductive trace layers are patterned using well known techniques such as copper/polyamide processing and/or selective etching. FIG. 1 shows a conductive trace layer 101 formed in accordance with the invention on a first surface 100 of an interconnection substrate base structure. First conductive trace layer 101 includes generally vertical conductive traces 102 which run from side 103 to side 105 of the substrate. In accordance with the invention, vertical conductive traces 102 include vertical or "straight" segments 102A which are connected by vertically diagonal segments 102B.

After first conductive trace layer 101 is formed, first conductive trace layer 101 is covered with an insulating layer such as a polymer or polyamide (not shown in FIG. 1) by well known methods. A second conductive trace layer 201 (see FIG. 2A) is then formed over a first surface 200 of the insulation layer. Second conductive trace layer 201 includes generally horizontal conductive traces 202 which run from side 203 to side 205 of the substrate. According to the invention, horizontal conductive traces 202 include horizontal or "straight" segments 202A and horizontally diagonal segments 202B.

Figure 2A:
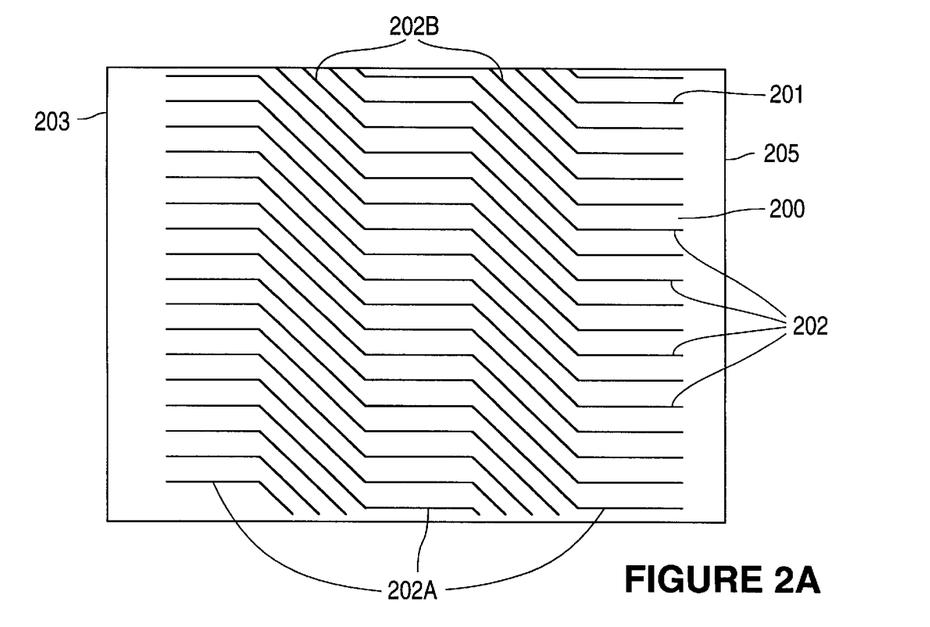
FIG. 2A shows a second conductive trace layer in accordance with the invention.
Figure 2B:
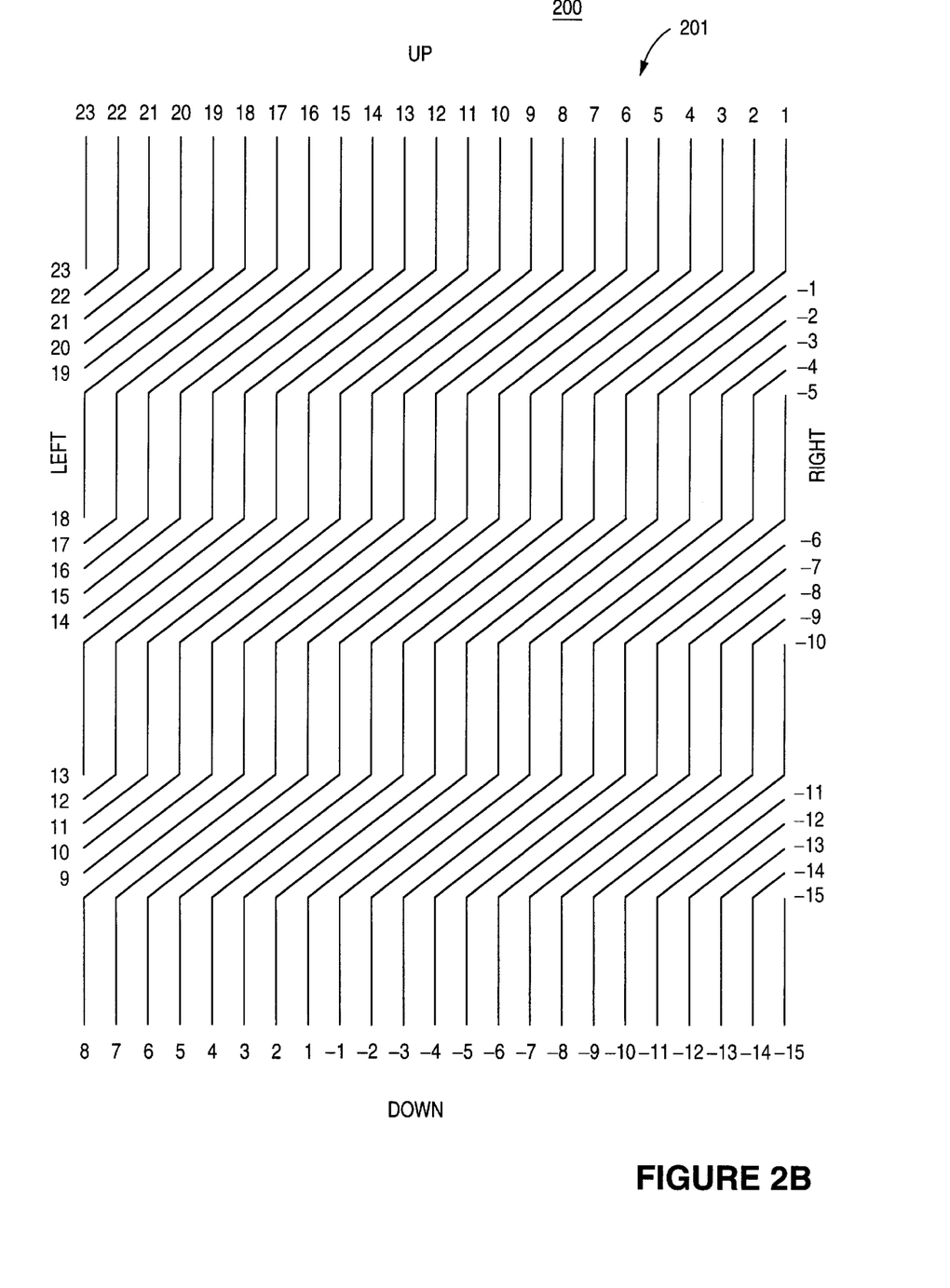
FIGS. 2B, 2C, and 2D show the use of the diagonal segments in the traces of FIGS. 1 and 2A.
Figure 2C:
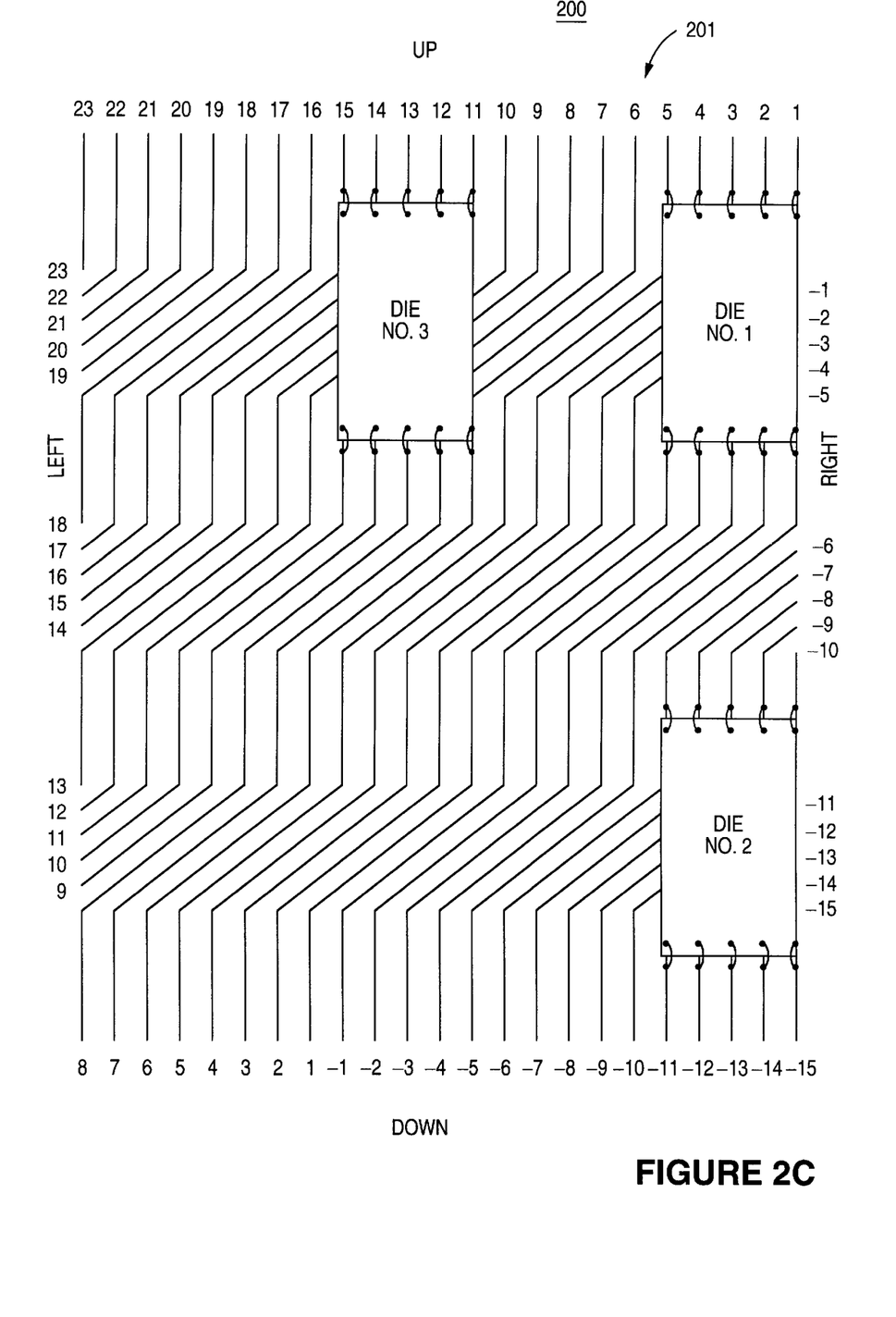
Figure 2D:
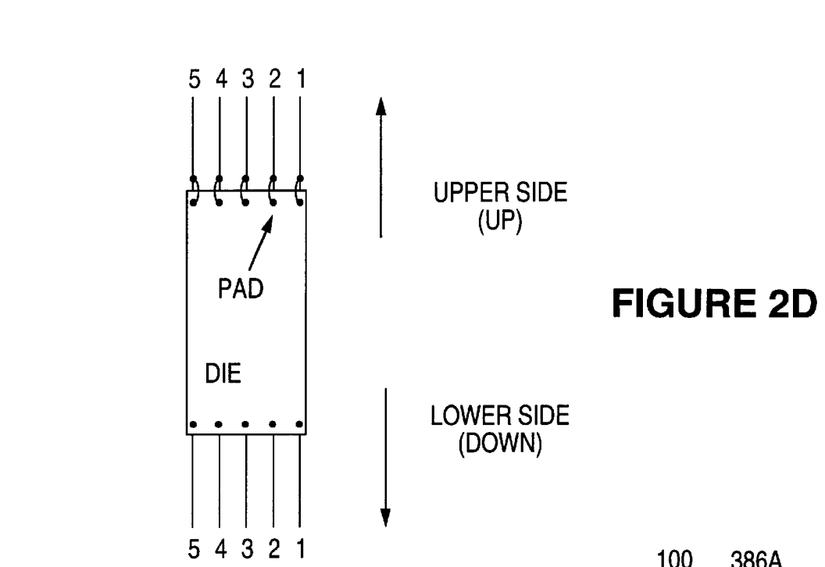

Regarding the diagonal trace segments, FIGS. 2B, 2C, 2D explain their utility. FIG. 2B shows one conductive trace layer, the upper layer 201 on surface 200, with no die mounted on it. Without diagonal segments, there would be only 23 trace lines (i.e. channels) numbered here 1, . . . , 23. With the diagonal segments there is room for 38 lines (i.e. channels) numbered here –15, . . . , –1, 1, . . . , 23. (Note that FIGS. 2B, 2C, 2D show the substrate of FIG. 2A rotated 90° to show that horizontal and vertical directions are only relative.) Suppose one wants to mount three dice numbered here 1, 2, 3 on the substrate surface 200 and each die 1, 2, 3 has ten interconnections, five from its upper side, and five from its down side, as in FIG. 2C. Each interconnection is from a pad on the die to a trace line (channel) on the upper layer 201.

If the traces were all straight (i.e. no diagonals), the situation would be as shown in FIG. 2D. The five pads on the upper die side will connect to trace lines 1, 2, 3, 4, 5, and the five pads on the die down side will not have any free trace lines to be connected to them.

Having diagonal segments thus enables one to connect the die pads on the upper side and the die pads of the lower side as follows:

| die no. | Pads on upper side connected to trace lines (channels) | Pads on lower (down) side connected to trace lines (channels) |
| --- | --- | --- |
| 1 | 1, 2, 3, 4, 5 | –1, –2, –3, –4, –5 |
| 2 | –6, –7, –8, –9, –10 | –11, –12, –13, –14, –15 |
| 3 | 11, 12, 13, 14, 15 | 6, 7, 8, 9, 10 |

So, using the diagonal trace segments, advantageously one can form connections to the two sides of the same die, and can mount more dice on a substrate of a given surface area.

Figure 3A:
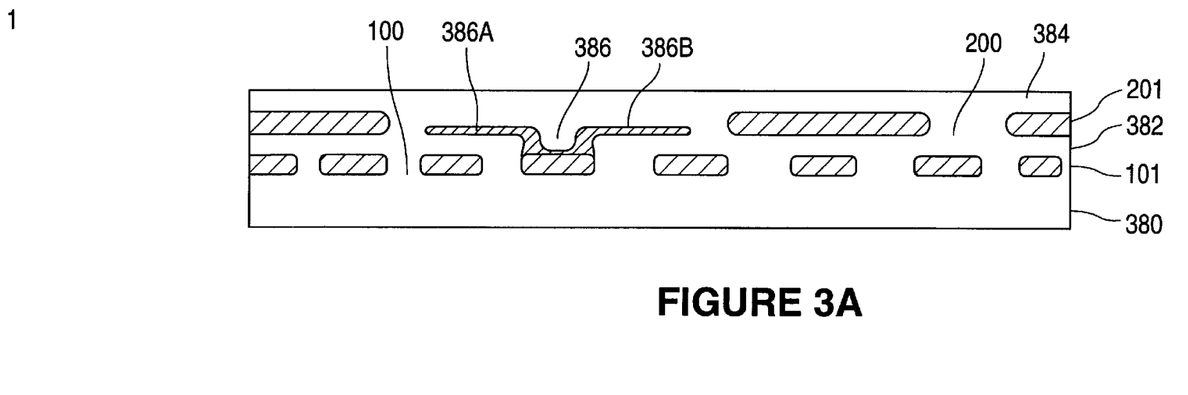
FIG. 3A shows a side view in cross-section of an un-programmed multi-chip module substrate in accordance with the invention.

FIG. 3A shows a side view in cross-section of an un-programmed multi-chip module substrate in accordance with the invention including: interconnection substrate base structure 380; first conductive trace layer 101; first insulating layer 382; first surface 200 of first insulating layer 382; and second conductive trace layer 201. As discussed in more detail below, in one embodiment of the invention, a second insulating layer 384 is selectively applied over second conductive trace layer 201. Second insulating layer 384, like first insulating layer 382, is typically a polymer or polyamide coating. Conventional conductive ground and power layers in base structure 380 are not shown.

Also shown in FIG. 3A is via 386 which is an opening through first insulating layer 382 to first conductive trace layer 101. As discussed in more detail below, via 386 is a plated or filled conductive via and includes conductive wing extension portions 386A and 386B extending outwardly from via 386 along first surface 200 of first insulating layer 382.

Those of skill in the art will recognize that in another embodiment of the invention, first conductive trace layer 101 is formed with conductive traces running generally horizontally and second conductive trace layer 201 is formed with conductive traces running generally vertically (see FIG. 2B).

Figure 3B:
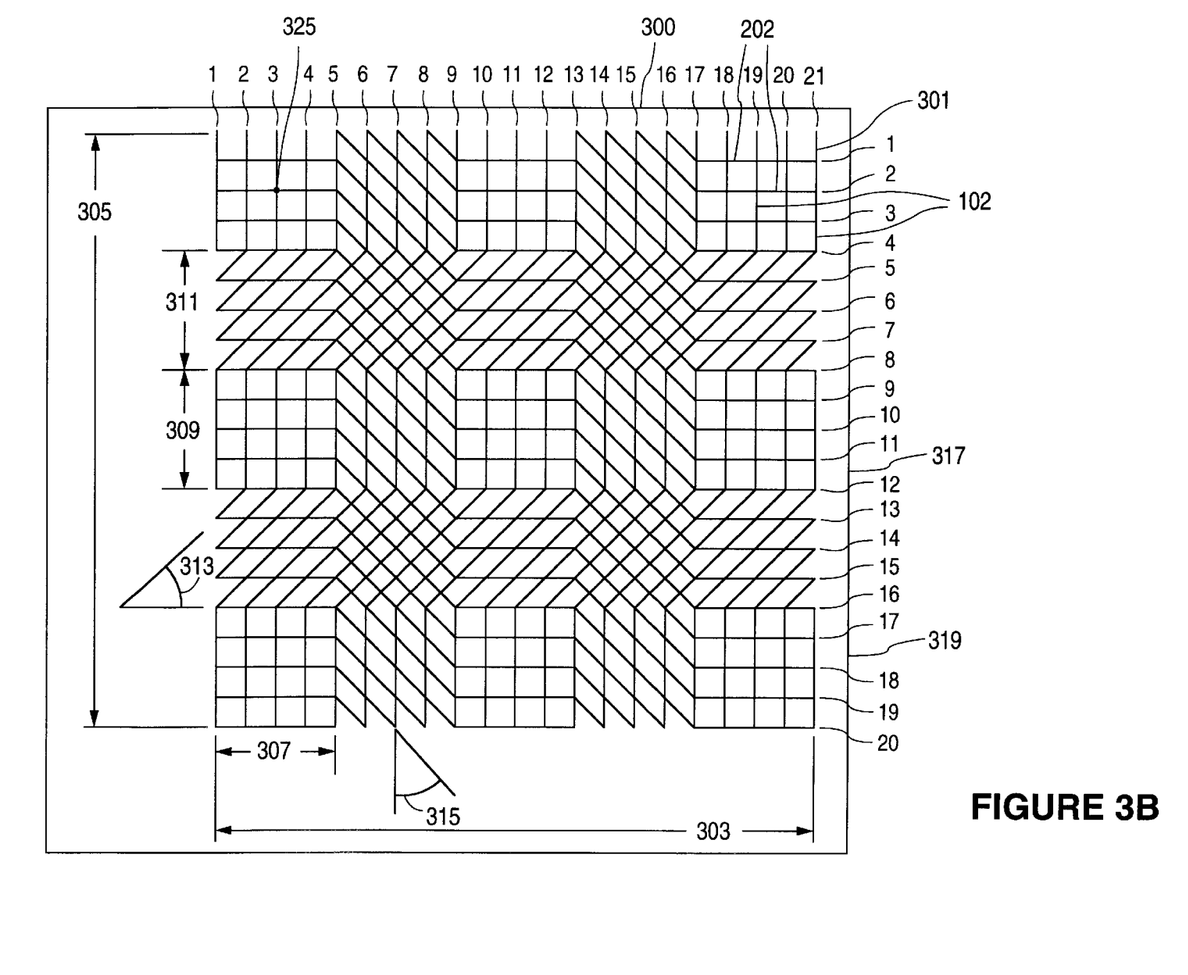
FIG. 3B shows a conductive trace grid in a substrate in accordance with the invention.

After conductive trace layers 101 and 201 have been formed with intervening insulating layer 382 of polymer or polyamide, the combination of conductive trace layers 101 and 201 forms a grid 301 of conductive traces as shown in FIG. 3B which corresponds to the combination of the layers of FIGS. 1 and 2A. For illustrative purposes, FIG. 3B does not show the polymer or polyamide coating which separates conductive trace layers 101 and 201.

In FIG. 3B, 303 is the width of substrate 300 while 305 is the length of substrate 300. Width 303 and length 305 are variable and can be chosen by the designer. The width 307 of the line step and the length 309 of the line step are also shown. In addition, the width 311 of the diagonal line step is shown.

Angle 313 in FIG. 3B is the angle between vertically diagonal trace segments 102B (see FIG. 1) and the horizontal or X axis. Angle 315 is the angle between the horizontally diagonal trace segments 202B (see FIG. 2) and the vertical or Y axis. In one embodiment of the invention, angle 313 and angle 315 are equal so that the vertically diagonal conductive trace segments 102B are perpendicular to the horizontally diagonal conductive trace segments 202B (see FIG. 1, FIG. 2A and 3B). Of course, angles 313 and 315 are variable and can be chosen by the manufacturer or user of substrate 300.

In accordance with the invention, horizontal or "straight" conductive trace segments 202A and vertical or "straight" conductive trace segments 102A form a plurality of standard grids or islands such as grids 317 and 319 shown in FIG. 3B. For illustrative purposes, vertical conductive traces 102 (see FIG. 1) are labeled 1 through 21 in FIG. 3B and horizontal conductive traces 202 (see FIG. 2) are labeled 1 through 20 in FIG. 3B. (This numbering scheme differs from that used above in FIGS. 2B to 2D). In the following discussion each connection point is referred to as a node in the matrix of possible connections shown in FIG. 3B.

The physical connection points or nodes can be anywhere inside the substrate depending on the conjunction location between the vertical conductive trace line and the horizontal conductive trace line in question. As discussed above, according to the invention, vertical conductive traces 102 include vertical or straight segments 102A and vertically diagonal segments 102B. Similarly, horizontal conductive traces 202 include horizontal or straight segments 202A and horizontally diagonal segments 202B. As a result of this structure, two types of connections can be made according to the invention; connections between vertical and horizontal straight segments 102A and 202A and connections between vertically diagonal segments 102B and horizontally diagonal line segments 202B.

As discussed above, vertical conductive traces 102 (see FIG. 1) and horizontal conductive traces 202 (see FIG. 2) are separated by intervening insulating layer 382 (see FIG. 3A). In order to electrically connect traces from conductive trace layers 102 and 202, vias 386 (see FIG. 3A) are formed at junction locations. Vias are well known for connecting two conductive trace layers separated by an insulating layer. Typically vias are holes which are drilled or etched between the two conductive trace layers and then coated with a conductive material e.g. aluminum. As discussed above, FIG. 3A shows a single via 386 between conductive trace layer 201 and conductive trace layer 101 through insulating layer 382. As also discussed above, the vias formed in substrate 300 for use with the invention include wing extension portions 386A and 386B which are also formed of electrically conductive material and extend laterally from via 386 along surface 200 of insulating layer 382.

Figure 4A:
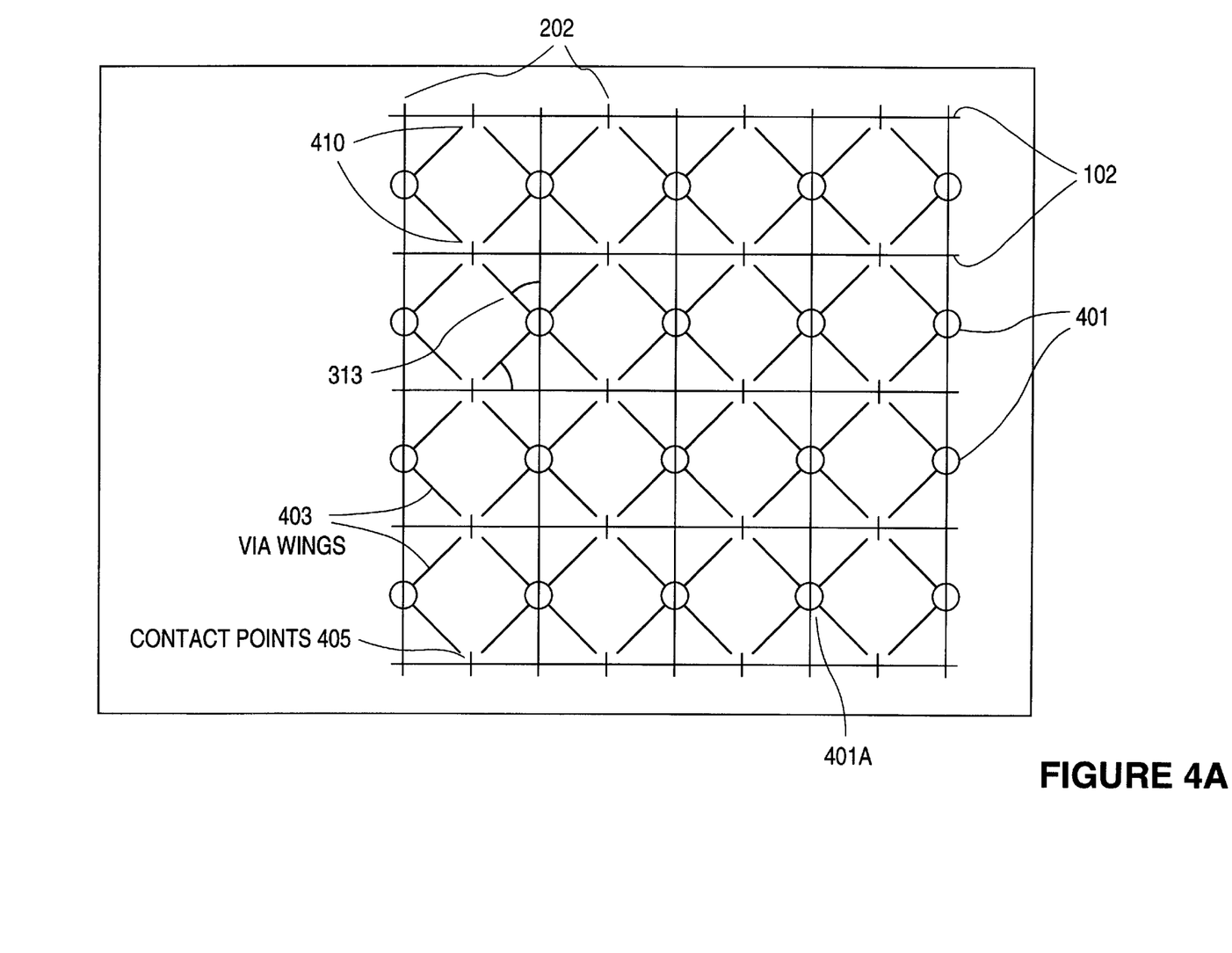
FIG. 4A shows one embodiment of a basic via connection pattern according to the invention.

FIG. 4A shows one example of an exemplary basic via connection pattern according to the invention. Alternatively, the vias can be patterned such that the vias are staggered at every other node or are present at only selected nodes. The actual pattern employed varies according to the needs of the designer.

In the embodiment of FIG. 4A, via wing extensions 403 extend outwardly from vias 401 at angle 313 from vertical conductive traces 102. In one embodiment, angle 313 is 45° and each via wing extension 403 is separated from the adjoining wing extension by a 90° angle. Via wing extensions 403 are typically, but not necessarily, of the same conductive material that coats vias 401 such as aluminum, tin or a conductive alloy. Via wing extensions 403 are formed by well known methods as e.g. selective etching or selective deposition.

Contact points 405 in FIG. 4A are points on conductive trace layer 201, i.e. points on horizontal conductive traces 202. As seen in FIG. 4A via wing extensions 403 extend from vias 401 to points just short of contact points 405, with predetermined gaps 410 between via wing extensions 403 and contact points 405.

Figure 4B:
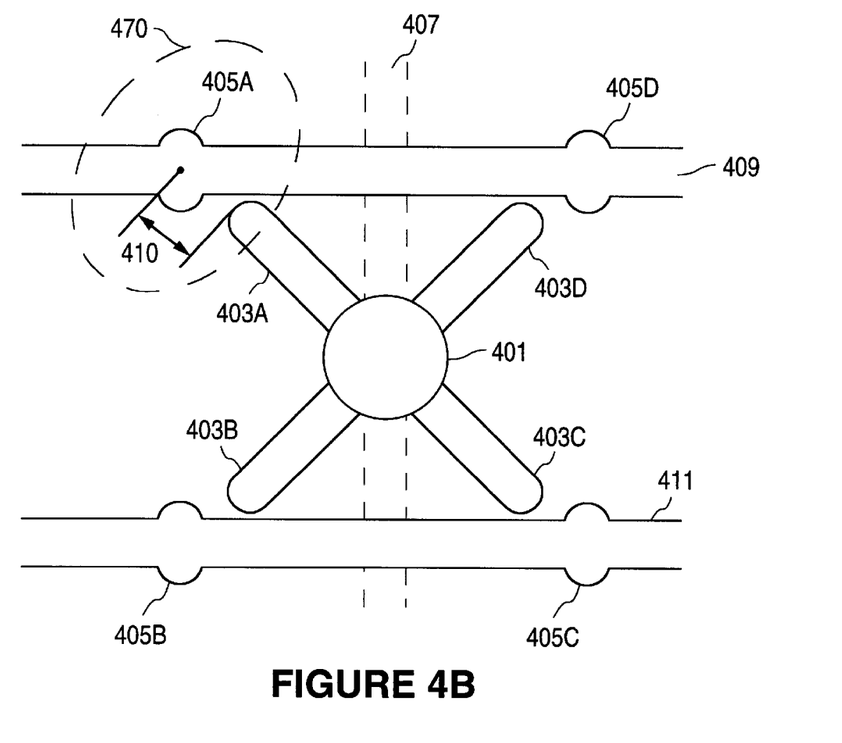
FIG. 4B is a close-up of a single via including via wing extensions according to the invention.

To better illustrate this, a single via 401A (see FIG. 4A) as shown in FIG. 4B includes vertical conductive trace 407 and horizontal conductive traces 409 and 411. Vertical conductive trace 407 is shown in dashed lines to indicate that vertical trace 407 is located below horizontal traces 409 and 411, under first insulation layer 382 (see FIG. 3A). FIG. 4A also shows via wing extensions 403A, 403B, 403C and 403D which approach, but do not contact, contact points 405A, 405B, 405C and 405D, respectively. Consequently, as discussed above, these are predetermined gaps 410 between via wing extensions 403A–403D and contact points 405A–405D, respectively. Gaps 410 are typically smaller than the diameter of a conventional ball bond.

As discussed above, contact points 405A, 405B, 405C, and 405D are located on horizontal conductive traces 409 and 411 which are part of the set of horizontal conductive traces 202 (see FIG. 2) on second conductive trace layer 201. On the other hand, vertical conductive trace 407 is on first conductive trace layer 101 (see FIG. 1). Via wing extensions 403A–403D are on second conductive trace layer 201 and via 401A extends from second conductive trace layer 201 to first conductive trace layer 101. Consequently, via wing extensions 403A–403D can be used to make electrical connection between vertical conductive traces 102 on first conductive trace layer 101 and horizontal conductive traces 202 on second conductive trace layer 201 (see FIG. 3A). However, since via wing extensions 403A–403D come close to, but do not make actual physical contact, with connection points 405A–405D, selective connection is made between vertical conductive traces 102 and horizontal conductive traces 202 by filling selected gaps 410 (see FIGS. 4A and 4B). As discussed in more detail below, wire bonding or ball bonds are used to make these selective connections.

Figure 5:
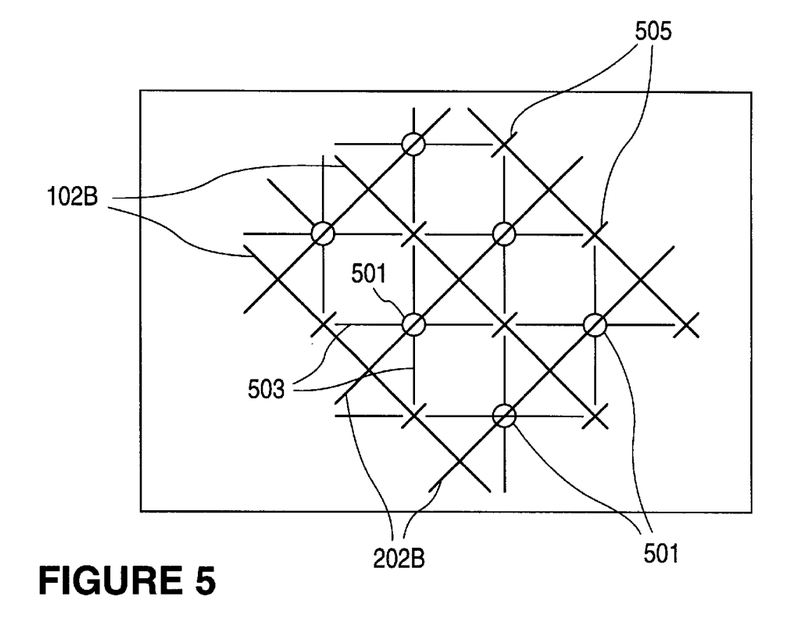
FIG. 5 shows a via connection pattern used to make the connection between vertically and horizontally diagonally conductive trace segments.

FIG. 5 shows a via connection pattern similar to the via connection pattern shown in FIG. 4A, except that the vias shown in FIG. 5 make connections between vertically and horizontally diagonal conductive trace segments 102B and 202B (see FIGS. 1 and 2). As shown in FIG. 5, vertically diagonal conductive trace segments 102B are connected to horizontally diagonal conductive trace segments 202B by vias, such as via 501, which include via wing extensions 503. Like via wing extensions 403 (see FIG. 4A), via wing extensions 503 come close to but do not physically contact points 505 on horizontally diagonal conductive trace segments 202B.

Referring back to FIGS. 3A and 3B, after substrate 300 is formed, one or more integrated circuit die (chips), see FIG.

2C, are mounted on substrate 300 to form a multi-chip module (MCM). According to the invention, each pad or bonding location on each die is connected to one of the conductive traces from the set of conductive traces 102 and 202 by vias 386 and well known surface mounting methods, e.g. bonding or flip-chip bonding. In one embodiment of the invention, the dice are connected to the "standard" grid portions or islands 317 or 319 of grid 301.

After each pad on each integrated circuit chip in the MCM is connected to one of the conductive traces making up conductive trace sets 102 or 202, the individual pads on the integrated circuit chips in the multi-chip module can be inter-connected by connecting the two traces which are attached to the two pads. To make some connections, the two conductive traces can be connected directly at a junction location or node. To make other connections, a third or fourth available conductive trace is employed as a "jumper" connection.

For instance, referring to FIG. 3B, to connect an integrated circuit pad that is bonded to vertical conductive trace 3 with a second integrated circuit pad which is bonded to horizontal conductive trace 10, a connection is made at the node of vertical conductive trace 3 and horizontal conductive trace 10 (see point 325 in FIG. 3B). In order to make this electrical connection, point 325 would include a via such as via 401 shown in FIG. 4B. As discussed above, via 401 is electrically connected to vertically conductive trace 407 which, in this instance, would equate to vertical conductive trace 3 (see FIG. 3B). In this case, horizontal conductive trace 409 in FIG. 4B is horizontal conductive trace 10 in FIG. 3B. Consequently, a connection is made between vertical conductive trace 3 and horizontal conductive trace 10 by connecting either wing extension 403A or 403D in FIG. 4B to contact points 405A or 405D respectively. As also discussed above any, or all, of the nodes shown in FIG. 3B can include a via such as that shown in FIG. 4B.

According to the invention, after the multi-chip module interconnection substrate 300 is formed including vias, such as via 401 shown in FIG. 4B, at each of the nodes, multi-chip module interconnection substrate 300 can be programmed, e.g., in the field, to make the appropriate connections for the application of the multi-chip module.

Figure 6A:
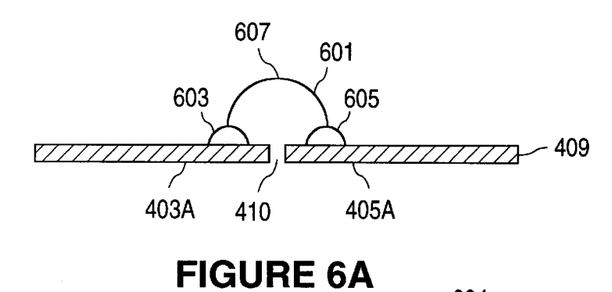
FIG. 6A shows one method according to the invention for making the electrical connection between a via and a conductive trace using wire bonding.

FIG. 6A shows a side view of the portion 470 of FIG. 4B which includes: a portion of via wing extension 403A; connection point 405A; and gap 410. In this embodiment, gap 410 between the end of via wing extension 403A and horizontal conductive trace 409 is bridged by forming a wire bond 601 between via wing extension 403A and connection point 405A on horizontal conductive trace 409. Wire bond 601 includes solder balls 603 and 605 and wire 607.

Wire bonding is well known for surface mounting an integrated circuit; wire bonds can be made by a conventional wire bonder such as model 1484 from Kulike and Soffe of Horsham, Pa. Using this method, conductive material is fed from a capillary (not shown) on the wire bonder (not shown) and an electrical spark or combustible gas melts the tip of the wire forming ball 603. Then the capillary is moved horizontally while feeding out wire 607. The capillary then touches down at contact point 405A and forms a second solder ball 605.

Figure 6B:
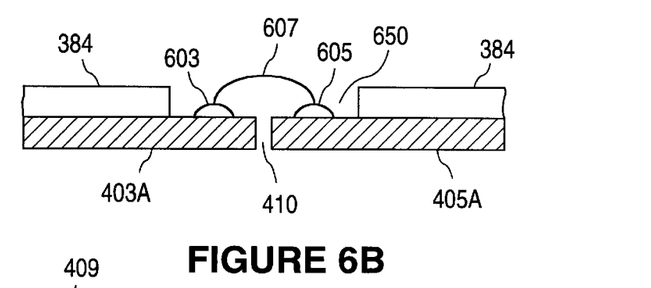
FIG. 6B shows the method of FIG. 6A employed on a structure which includes a second insulative layer.

FIG. 6B shows a second embodiment of the invention which includes second insulative layer 384. As discussed above, second insulative layer 384 is optional. However, when second insulative layer 384 is employed, portions of insulative layer 384 are selectively etched away by well known methods to expose the node and form well 650. This etching can be done at each node e.g., by the substrate manufacturer, or at only selected nodes by the MCM user. Then the connection between via wing extension 403A and connection point 405A across gap 410A is made, by the methods described above with respect to FIG. 6A, in well 650.

Figure 6C:
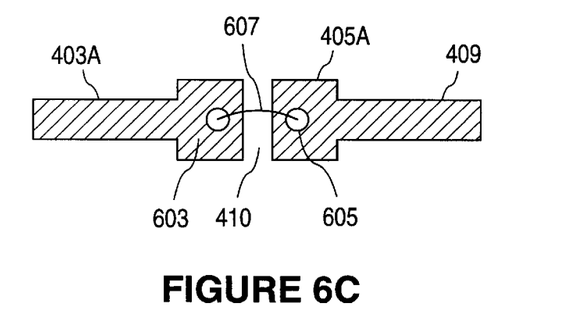
FIG. 6C is an overhead view of the electrical connection formed in FIG. 6A.

FIG. 6C shows an overhead view of the connection discussed above with respect to FIGS. 6A and 6B.

In addition to forming electrical connections between via wing extensions 403A–403D and connection points 405A–405D, respectively, the wire bonding methods discussed above can also be used to connect individual conductive traces of the sets of conductive traces 102 and 202 by using the wire bonds to traverse the gap between adjacent horizontal or vertical traces.

The method for making the electrical connection using conventional wire bonding equipment discussed above is simpler and cheaper than methods used with prior art programmable multi-chip module substrates. In addition, the method can be implemented, in many cases, using existing equipment without the need for a significant capital investment in new processing equipment.

Figure 7A:
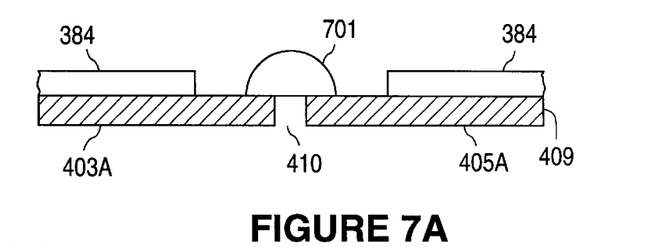
FIG. 7A shows another method according to the invention for making the electrical connection between a via and a conductive trace using a ball bond.
Figure 7B:
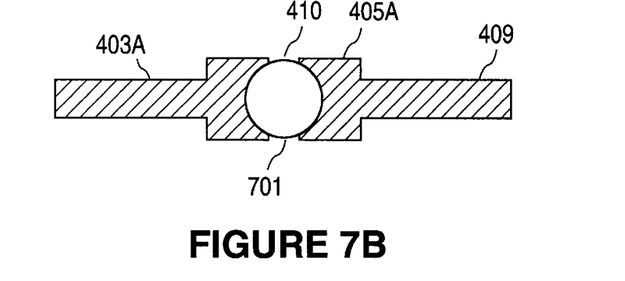
FIG. 7B shows an overhead view of the electrical connection made in FIG. 7A.

FIG. 7A shows yet another embodiment of the invention wherein the connections between via wing extensions 403 and connection points 405 (see FIG. 4A) are made using ball bonds, which are also produced by a conventional wire bonder. In this embodiment, gap 410 between via wing extension 403A and connection point 405A is bridged by a single ball of solder 701 called a ball bond. FIG. 7A also shows (optional) second insulation layer 384. FIG. 7B shows an overhead view of the connection of FIG. 7A including: via wing extension 403A; connection point 405A; gap 410A; ball bond 701; and horizontal conductive trace 409.

Ball bonds are well known for forming a surface "flip-chip" type connection between an integrated circuit chip and a substrate. A ball bond, in its simplest form, is a ball of solder deposited by a capillary.

The embodiment of FIG. 7A and 7B has the further advantage in that there is no resulting wire 607 (see FIG. 7A) which undesirably is susceptible to breakage, shorting, or "wire sweep" during shipping and handling or operation of the multi-chip module. Consequently, this embodiment is particularly reliable for field programming a multi-chip module substrate.

The methods of making the electrical connections discussed above with respect to FIGS. 6A, 6B, 6C, 7A and 7B, are advantageous in utilizing commercially available equipment, which was previously used only for making surface connections between an integrated circuit chip and a substrate, i.e. wire bonding. Ball bonds were not previously used to fill gaps between conductive traces.

According to the invention, these technologies are used to make the various interconnections between conductive traces in a programmable substrate which can be pre-fabricated at the factory as a generic (unprogrammed) structure and then the substrates can either be programmed by the MCM assembler, i.e. "in the field", or the substrate can be custom programmed by the manufacturer to meet the user's specifications. Consequently, this method is an inexpensive and easily implemented method of designing a programmable multichip module interconnection substrate.

A detailed description of several embodiments of the invention is provided above. While this description is made with reference to the specific embodiments, it is only illustrative, and is not to be construed as limiting the invention. Various modifications can be made to the embodiments described above by those skilled in the art without departing from the spirit and scope of the invention as defined by the appended claims.

We claim:

1. A programmable interconnection substrate comprising:
    a first conductive trace layer formed within said interconnection substrate;
    a first insulating layer having a first surface and a second surface opposite said first surface, said second surface of said first insulating layer facing said first conductive trace layer;
    a second conductive trace layer formed on said first surface of said first insulating layer;
    a plurality of conductive vias, each conductive via being a conductive structure extending from said second conductive trace layer, through said first insulating layer, to said first conductive trace layer, and each said conductive via including at least one conductive via extension extending from said conductive via along said first surface of said insulation layer;
    a second insulating layer over said second conductive trace layer;
    wherein said first conductive trace layer comprises a first plurality of electrical conductors oriented in a first direction;
    said second conductive trace layer comprises a second plurality of electrical conductors oriented in a second direction; and
    said first insulating layer is between said first and second conductive trace layers.

2. A programmable interconnection substrate comprises;
    a first conductive trace layer formed within said interconnection substrate;
    a first insulating layer having a first surface and a second surface opposite said first surface, said second surface of said first insulating layer facing said first conductive trace layer;
    a second conductive trace layer formed on said first surface of said first insulating layer;
    a plurality of conductive vias, each conductive via being a conductive structure extending from said second conductive trace layer, through said first insulating layer, to said first conductive trace layer, and each said conductive via including at least one conductive via extension extending from said conductive via along said first surface of said insulation layer, and wherein;
    said first conductive trace layer comprises a first plurality of electrical conductors oriented in a first direction;
    said second conductive trace layer comprises a second plurality of electrical conductors oriented in a second direction, different from said first direction; and
    said conductive via wing extensions extend from said conductive vias such that each of said conductive via extensions terminates a pre-determined distance from said electrical conductors comprising said second conductive trace layer to define a non-conductive gap therebetween.

3. The programmable interconnection substrate of claim 2, further comprising:
    wire bonds, said wire bonds connecting selected ones of said conductive via extensions to selected ones of said electrical conductors comprising said second conductive trace layer, whereby said wire bonds form selected electrical connections between said first and second conductive trace layers.

4. The programmable interconnection substrate of claim 2, further comprising;
    ball bonds, said ball bonds being selectively deposited in said gaps between said conductive via extensions and selected ones of said plurality of electrical conductors comprising said second conductive trace layer, whereby said ball bonds form selected electrical connections between said first and second conductive trace layers.

5. The programmable interconnection substrate of claim 2, further comprising a second insulating layer selectively applied over said second conductive trace layer.

6. The programmable interconnection substrate of claim 2, wherein each said conductive via is a plated cavity.

7. The programmable interconnection substrate of claim 2, further comprising:
    a conductive ground plane layer within said interconnection substrate, said ground plane layer being electrically insulated from said first and said second conductive trace layers; and
    a conductive power plane layer within said interconnection substrate, said power plane layer being electrically insulated from said first and second conductive trace layers and from said ground plane layer.

8. The programmable interconnection substrate of claim 2, wherein said first plurality of electrical conductors comprising said first conductive trace layer each includes straight segments oriented in a first direction and diagonal segments diagonally oriented at a pre-determined angle from said first direction; and
    said second plurality of electrical conductors comprising said second conductive trace layer each includes straight segments oriented in a second direction and diagonal segments diagonally oriented at a pre-determined angle from said second direction.

9. The programmable interconnection substrate of claim 8, wherein said second direction is orthogonal to said first direction and said angle between said diagonal segments of said first plurality of electrical conductors and said first direction is equal to said angle between said diagonal segments of said second plurality of electrical conductors and said second direction, whereby said straight segments of said first plurality electrical conductors are orthogonal to said straight segments of said second plurality of electrical conductors, and said diagonal segments of said first plurality of electrical conductors are orthogonal to said diagonal segments of second plurality of electrical conductors.

10. The programmable interconnection substrate of claim 8, further comprising:
    wire bonds connecting selected ones of said conductive via extensions to selected ones of said electrical conductors comprising said second conductive trace layer, whereby said wire bonds form selected electrical connections between said first and second conductive trace layers.

11. The programmable interconnection substrate of claim 8, further comprising; ball bonds selectively deposited in said non-conductive gap between said conductive via extensions and selected ones of said plurality of electrical conductors comprising said second conductive trace layer, whereby said ball bonds form selected electrical connections between said first and second conductive trace layers.

12. The programmable interconnection substrate of claim 8, wherein:

said interconnection substrate comprises a rectangular semiconductor substrate;

said first direction is parallel to a first edge of said interconnection substrate; and said second direction is perpendicular to said first edge of said interconnection substrate.

13. The programmable interconnection substrate of claim 8, further comprising a second insulating layer selectively applied over said second conductive trace layer.

14. The programmable interconnection substrate of claim 8, further comprising:

a second insulating layer over said second conductive trace layer, wherein said first insulating layer is between said first and second conductive trace layers.

15. The programmable interconnection substrate of claim 8, wherein each said conductive via is a plated cavity.

16. The programmable interconnection substrate of claim 8, further comprising:

a conductive ground plane layer within said interconnection substrate, said ground plane layer being electrically insulated from said first and said second conductive trace layers; and a conductive power plane layer within said interconnection substrate, said power plane layer being electrically insulated from said first and second conductive trace layers and from said ground plane layer.

* * * * *